(12) United States Patent
Hsu

(10) Patent No.: US 6,755,692 B2
(45) Date of Patent: Jun. 29, 2004

(54) CONNECTING PIN STRUCTURE FOR A TRANSFORMER CORE

(76) Inventor: Wen-Hao Hsu, 13F, No. 40, Shui Nan St., Lu Chou City, Taipei Hsien (TW)

( * ) Notice: Subject to any disclaimer, the term of this patent is extended or adjusted under 35 U.S.C. 154(b) by 0 days.

(21) Appl. No.: 10/212,176

(22) Filed: Aug. 6, 2002

(65) Prior Publication Data

US 2004/0027223 A1 Feb. 12, 2004

(51) Int. Cl.[7] .............................................. H01R 13/66
(52) U.S. Cl. ....................................... 439/620; 336/192
(58) Field of Search ................... 439/83, 620; 336/192, 336/198; 361/736, 836

(56) References Cited

U.S. PATENT DOCUMENTS 5,823,801 A * 10/1998 Elkhatib ...................... 439/83
5,915,979 A * 6/1999 Schell et al. ................. 439/83
5,919,052 A * 7/1999 Ho .............................. 439/83

* cited by examiner

Primary Examiner—Gary Paumen
Assistant Examiner—James R. Harvey
(74) Attorney, Agent, or Firm—Rosenberg, Klein & Lee

(57) ABSTRACT

The connecting pin structure for a transformer core includes an insulating main body having a plurality of recesses therein at its bottom; a plurality of connecting pins installed in the plurality of recesses therein at the bottom of the insulating main body; and at least one coil secured on the insulating main body, the coil has terminal wirings respectively being connected to the connecting pins. The occupied laterally expanded dimension on a printed circuit board (PCB) of the connecting pins is reduced. Further, the L-shaped connecting pins are easy to assembly.

3 Claims, 5 Drawing Sheets

CONNECTING PIN STRUCTURE FOR A TRANSFORMER CORE

BACKGROUND OF THE INVENTION

1. Field of the Invention

The present invention relates to an improved connecting pin structure for a transformer core and in particular, an improved connecting pin structure for a transformer core with a reduced lateral dimension. Since the connecting pin structure according to the present invention is simplified, the required assembling machines during the assembling processes of the transformer core are also reduced, thereby promoting throughput.

2. Description of the Prior Art

FIG. 1 through FIG. 3 show a connecting pin structure 1A according to a prior art transformer core. As shown in figures, connecting pin structure 1A of the prior art transformer core has a main body 10A with a trapezoid-like roof. As best seen in FIG. 3, multiple fixing bases 101A is provided within the main body 10A. Coils 20A are secured to the multiple fixing bases 101A. Two terminal wirings 201A are connected to the bent connecting pins 30A arranged along periphery of the main body 10A. The bent connecting pins 30A are fixed on the main body 10A by passing through corresponding recesses 11A. This causes an undesirable expanded dimension in width. The increased width, as indicated in FIG. 3 as a distance "A", is undesirable since it will waste a great deal of area of an object to be connected with the transformer.

Referring to FIG. 4, another prior art connecting pin structure 1B is illustrated. The connecting pin structure 1B has a main body 10B with an approximately H-shaped cross section. Multiple bent connecting pins 30B are mounted in corresponding recesses 11B arranged along two opposite sidewalls of the main body 10B. With this configuration, the bent connecting pins 30B are typically bent into an S shape to facilitate following connection. Also, this causes an undesirable expanded dimension in width. The increased width, as indicated in FIG. 4 as a distance "C", when combined with a lateral width "D" of the main body 10B, is undesirable since it will waste a great deal of area of an object to be connected with the transformer.

The above-mentioned prior art connecting pin structures 1A and 1B both have connecting pins 30A and 30B that are laterally mounted on their associated main bodies 10A and 10B either through holes 11A or recesses 11B. Several drawbacks of such kind of connecting pin structures may be summarized as follows:

1. The laterally expanded connecting pins 30A and 30B occupy a large area of a receiving object when assembling.
2. The manufacture of such kind of S-shaped connecting pins 30A and 30B is time consuming and also expensive in cost. Besides, the connecting pins are subject to fracture problems since they are usually fabricated through multiple processing steps.
3. The S-shaped connecting pins 30A and 30B are difficult to assembly.
4. Since the assembly of the S shaped connecting pins 30A and 30B needs multiple special assembling machines to complete, the manufacturing cost is increased.

Thus, there is a strong need for an improved connecting, pin structure which is inexpensive and does not occupy too much space.

SUMMARY OF THE INVENTION

Accordingly, the main objective of the invention is to provide an improved connecting pin structure for a transformer core to solve the above-mentioned problems. The improved connecting pin structure is characterized in that the connecting pins, which are installed in vertical recesses that are arranged along two bottom peripheral sides of the insulating main body, are approximately L-shaped with a shrunk extended portion, thereby decreasing lateral dimension of the transformer core.

Another object of the present invention is to provide an improved connecting pin structure for a transformer core with a reduced lateral dimension. Since the connecting pin structure according to the present invention is simplified, the required assembling machines during the assembling processes of the transformer core are also reduced, thereby promoting throughput.

In accordance with the present invention, a connecting pin structure for a transformer core is provided. The connecting pin structure for a transformer core includes an insulating main body comprising a plurality of recesses therein at its bottom; a plurality of connecting pins installed in the plurality of recesses therein at the bottom of the insulating main body; and a coil secured on the insulating main body, the coil has terminal wirings connected to connecting pins.

Other objects, advantages and novel features of the invention will, become more clearly and readily apparent from the following detailed description when taken in conjunction with the accompanying drawings.

DETAILED DESCRIPTION OF THE PREFERRED EMBODIMENTS

Figure 1:
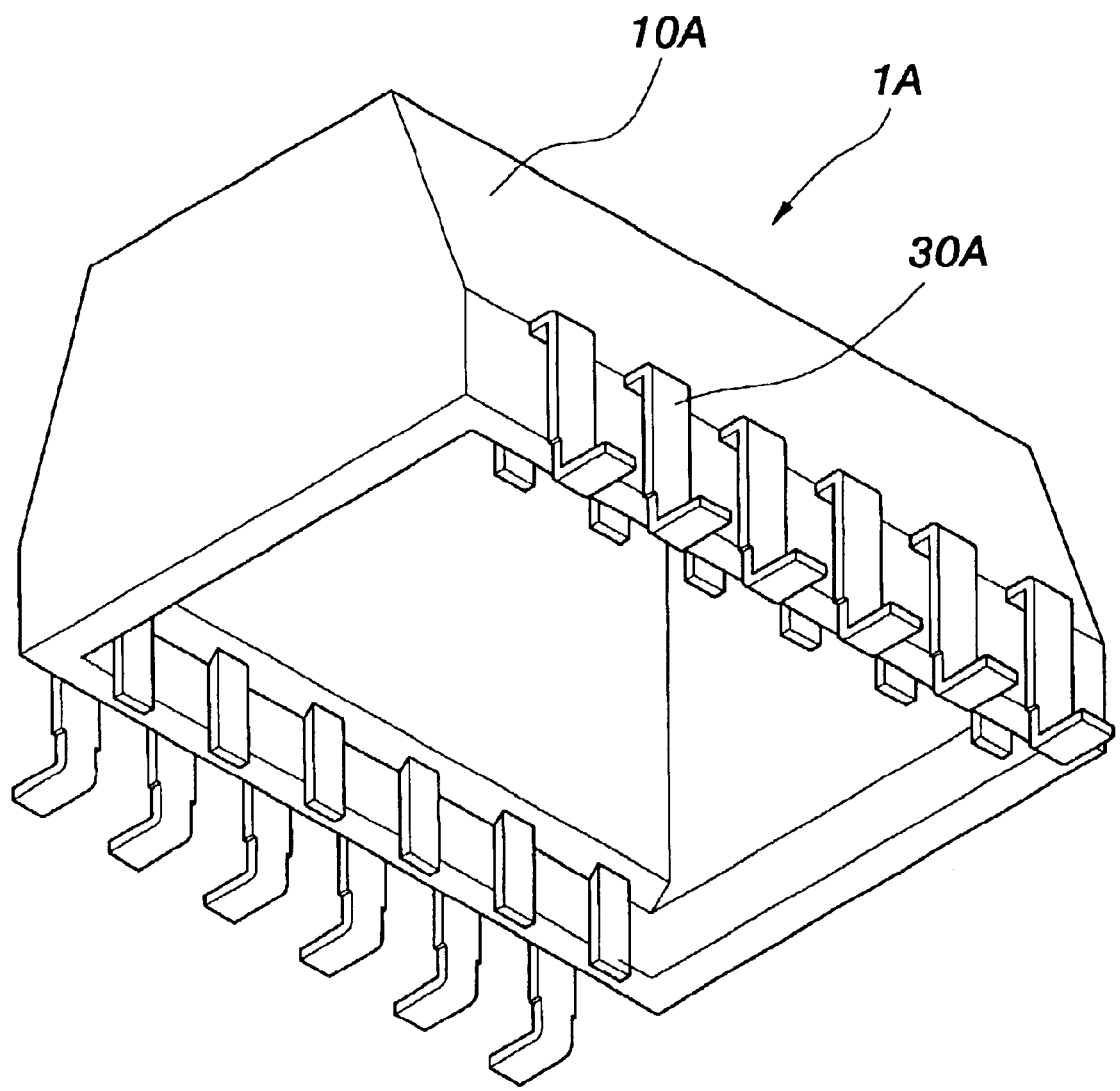
FIG. 1 is a perspective view of a connecting pin structure according to the prior art.
Figure 2:
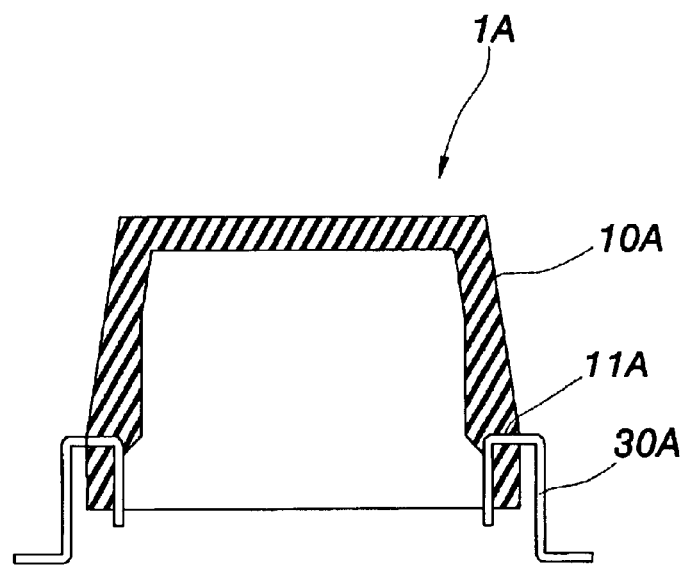
FIG. 2 is a cross-sectional view of a connecting pin structure according to the prior art.
Figure 3:
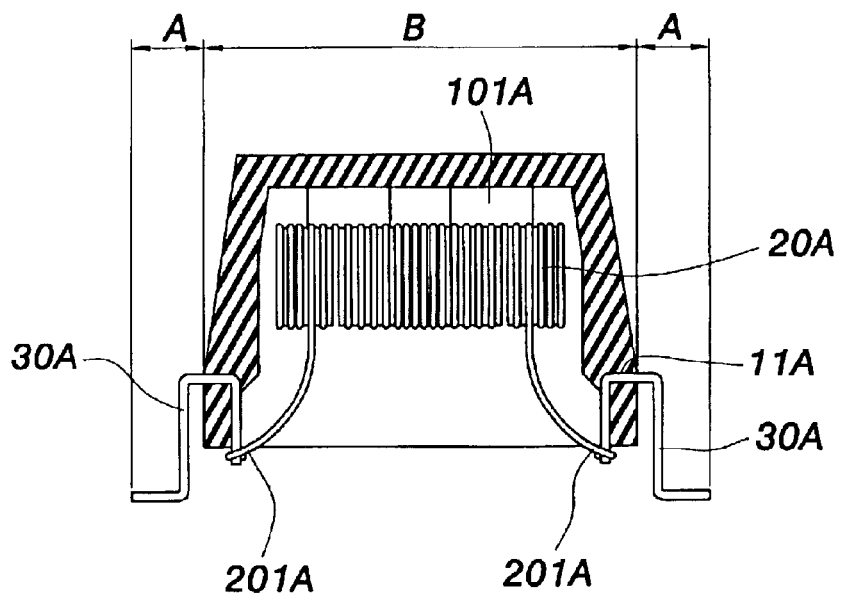
FIG. 3 is a cross-sectional view showing a coil in the connecting pin structure.
Figure 4:
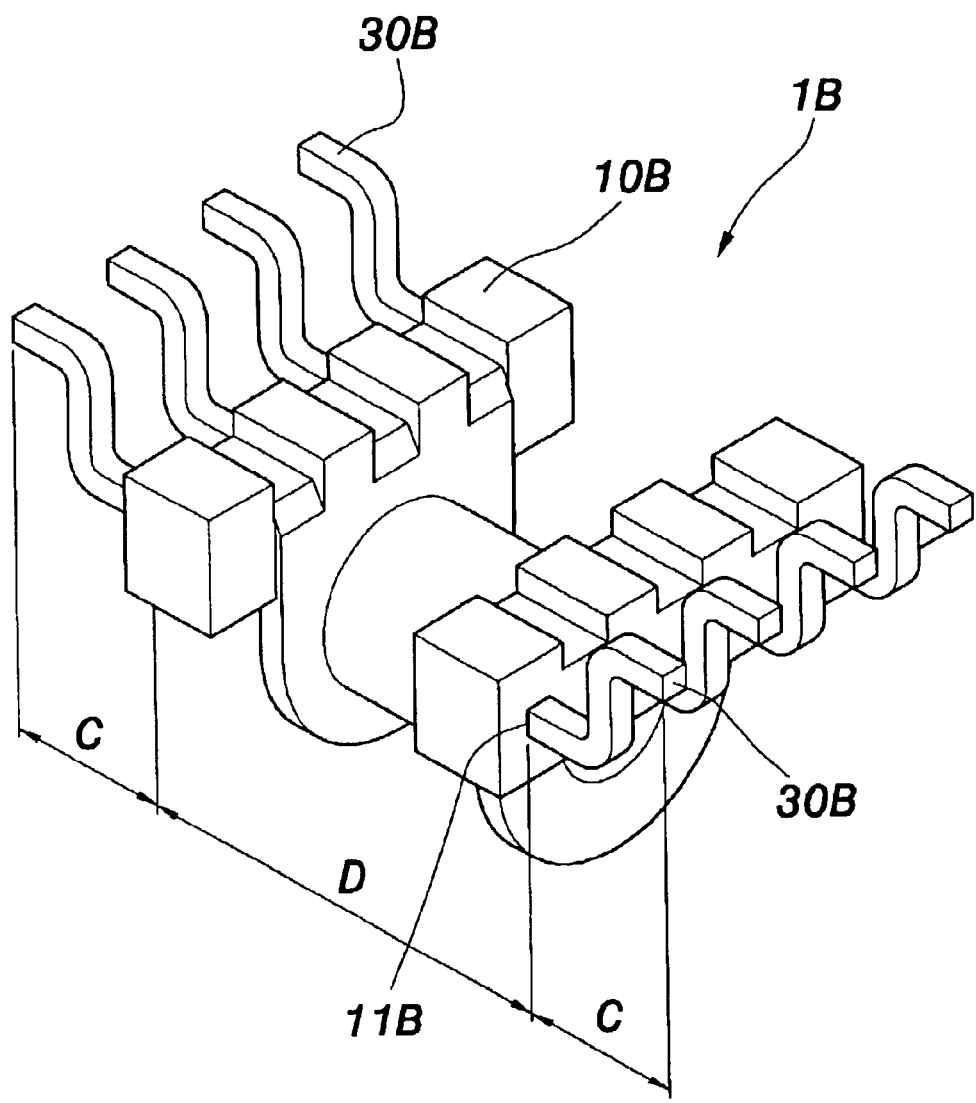
FIG. 4 is a perspective view of a connecting pin structure according to another embodiment of the prior art.
Figure 5:
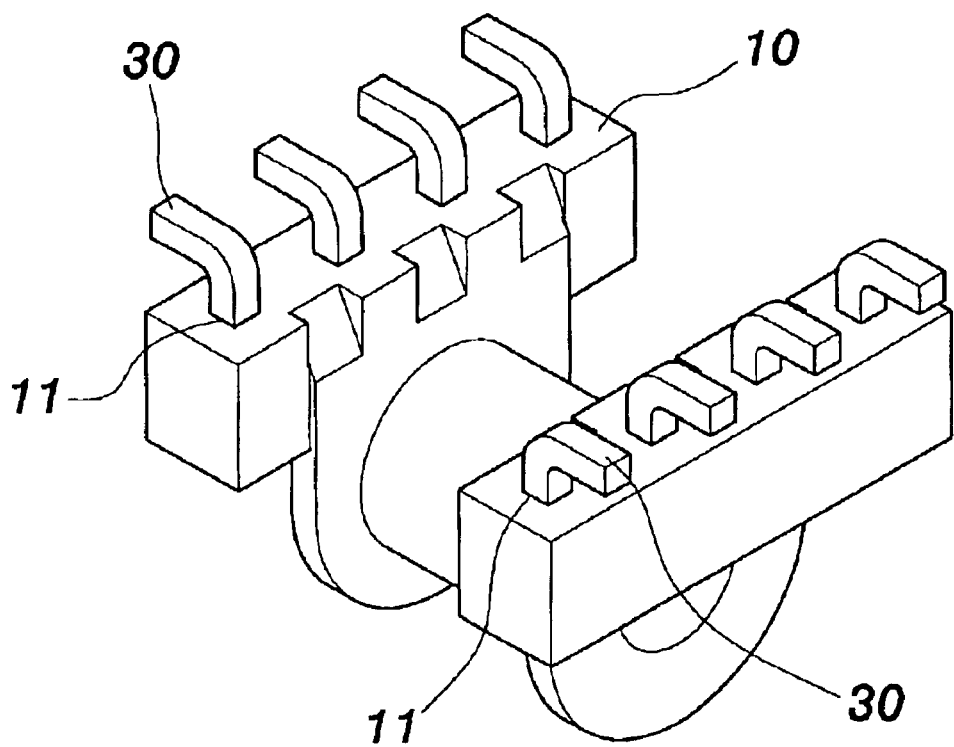
FIG. 5 is a perspective view of a connecting pin structure of this invention.
Figure 6:
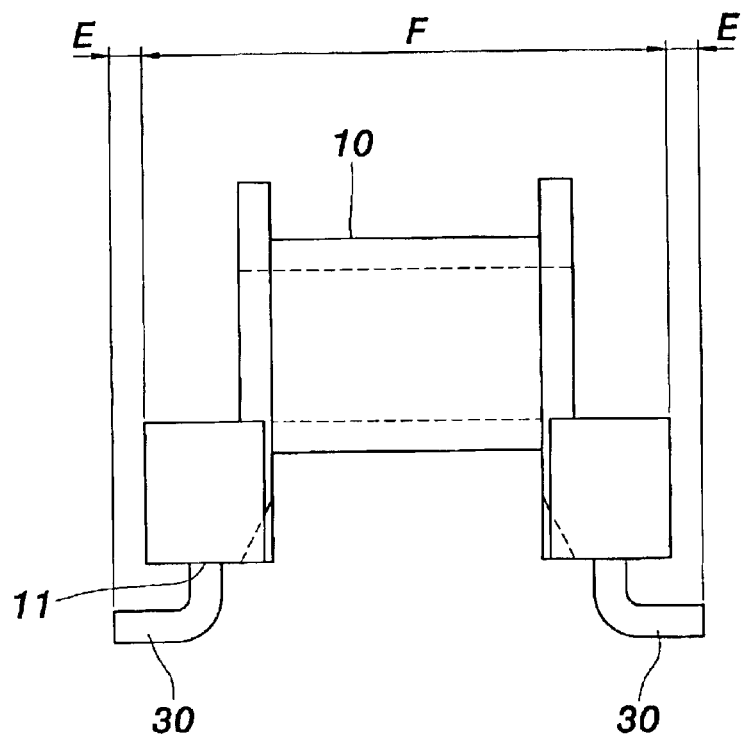
FIG. 6 is a cross-sectional view of a connecting pin structure of this invention.
Figure 7:
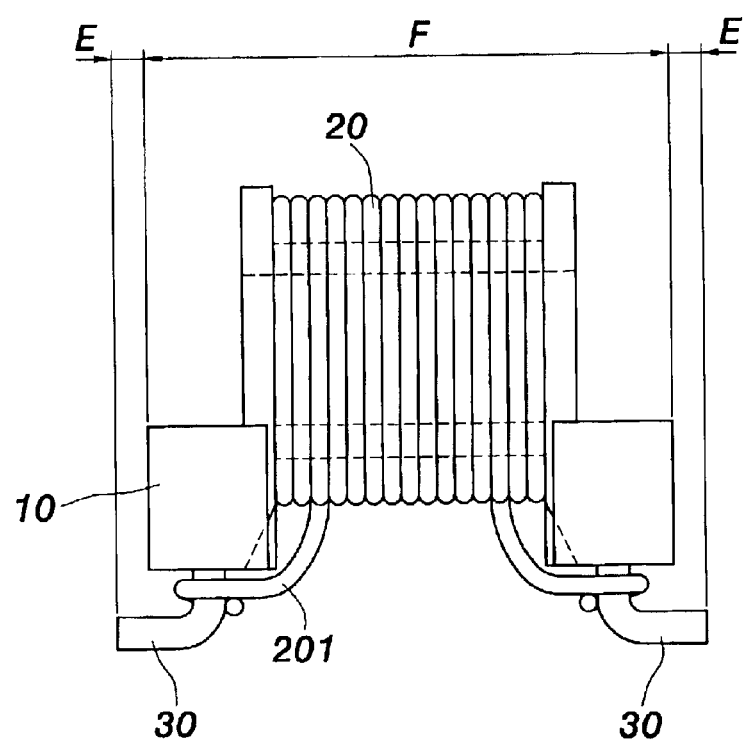
FIG. 7 is a cross-sectional view of a core wound around the connecting pin structure of this invention.

Please refer to FIG. 5 through FIG. 7, where FIG. 5 is a perspective view of this invention, FIG. 6 is a cross-sectional view of connecting pins that are secured onto an insulating main body according to the present invention, and FIG. 7 is a cross-sectional view of this invention.

The present invention is directed to an improved connecting pin structure of a transformer core. The connecting pin structure of the present invention comprises an insulating main body 10, at least one coil 20, and a plurality of connecting pins 30.

The insulating main body 10, which is made of insulating materials, is shaped to form a structure having an approximately, "H" cross section. There are a plurality of vertical recesses 11 arranged along two bottom peripheral sides of the H-shaped insulating main body 10. The coil 20 is wound around and secured on the insulating main body 10. Terminal wirings 201 are respectively connected to corresponding connecting pins 30 that are arranged along two bottom peripheral sides of the insulating main body 10.

As shown in FIG. 7, a plurality L-shaped connecting pins 30 are installed in vertical recesses 11 arranged along two bottom peripheral sides of the H-shaped insulating main body 10. The transformer assembly has a reduced out-extending dimension of "E". The projection area of the transformer assembly (dimension E combined with dimension F) is smaller than other similar transformer products on the market.

In this invention, multiple L-shaped connecting pins are installed in vertical recesses arranged along two bottom peripheral sides of the insulating main body. The occupied laterally expanded dimension on a printed circuit board (PCB) of the connecting pins is reduced. Further, the L-shaped connecting pins are easy to assembly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connecting pin structure for a transformer core, comprising:

an insulating main body having at least a pair of elongate connecting portions laterally spaced one from the other by an intermediate portion extending transversely therebetween, each of the connecting portions having a plurality of recesses formed at a bottom surface thereof, a plurality of substantially L-shaped connecting pins each engaging one of the recesses to project outward from the bottom surface of one of the insulating main body connecting portions; and, at least one coil wound to extend coaxially about the intermediate portion of the insulating main body, the coil having a plurality of terminal wirings extending to respectively ones of the connecting pins projecting from the insulating main body.

2. The connecting pin structure for a transformer core as claimed in claim 1, wherein the connecting and intermediate portions of the insulating main body are integrally formed of an insulative material.

3. The connecting pin structure for a transformer core as claimed in claim 1, wherein the connecting and intermediate portions of the insulating main body define a substantially H-shaped contour.

* * * * *